United States Patent [19]

Brown

[11] Patent Number: 6,075,733
[45] Date of Patent: Jun. 13, 2000

[54] TECHNIQUE FOR REDUCING PEAK CURRENT IN MEMORY OPERATION

[75] Inventor: Jeff S. Brown, Fort Collins, Colo.

[73] Assignee: LSI Logic Corporation, Milpitas, Calif.

[21] Appl. No.: 09/198,062

[22] Filed: Nov. 23, 1998

[51] Int. Cl.⁷ .................................................. G11C 7/00
[52] U.S. Cl. .......................................... 365/203; 365/205
[58] Field of Search ................................ 365/203, 204, 365/205

[56] References Cited

U.S. PATENT DOCUMENTS

| | | | |
|---|---|---|---|
| 5,367,488 | 11/1994 | An ........................................ | 365/189.01 |
| 5,418,749 | 5/1995 | Suda et al. ............................. | 365/203 |
| 5,623,446 | 4/1997 | Hisada et al. ....................... | 365/189.11 |
| 5,703,814 | 12/1997 | Nishimura et al. ................ | 365/189.09 |
| 5,706,230 | 1/1998 | Lee ....................................... | 365/189.11 |
| 5,710,738 | 1/1998 | Tai .......................................... | 365/203 |
| 5,745,421 | 4/1998 | Pham et al. ................................ | 36/203 |
| 5,757,714 | 5/1998 | Choi et al. ................................ | 365/226 |
| 5,768,199 | 6/1998 | Inoue ....................................... | 365/203 |
| 5,777,934 | 7/1998 | Lee et al. ................................. | 365/203 |
| 5,815,451 | 9/1998 | Tsuchida ................................. | 365/203 |
| 5,850,363 | 12/1998 | Jeon ........................................ | 365/203 |
| 5,886,937 | 3/1999 | Jang ........................................ | 365/203 |
| 5,903,503 | 5/1999 | Yamauchi et al. ...................... | 365/203 |
| 5,936,873 | 8/1999 | Kongetira ................................ | 365/49 |
| 5,936,905 | 8/1999 | Proebsting ............................. | 365/208 |
| 5,973,972 | 10/1999 | Kwon et al. ............................ | 365/203 |
| 5,978,271 | 11/1999 | Sato et al. .......................... | 365/185.22 |
| 5,982,688 | 11/1999 | Han ....................................... | 365/203 |

*Primary Examiner*—David Nelms
*Assistant Examiner*—Hien Nguyen

[57] ABSTRACT

A circuit in a memory device and a method for precharging at least one bit line in the memory device. The circuit includes a primary precharger and a secondary precharger in communication with the bit line. The secondary precharger gradually precharges the bit line before the primary precharger precharges the bit line between memory operations.

18 Claims, 1 Drawing Sheet

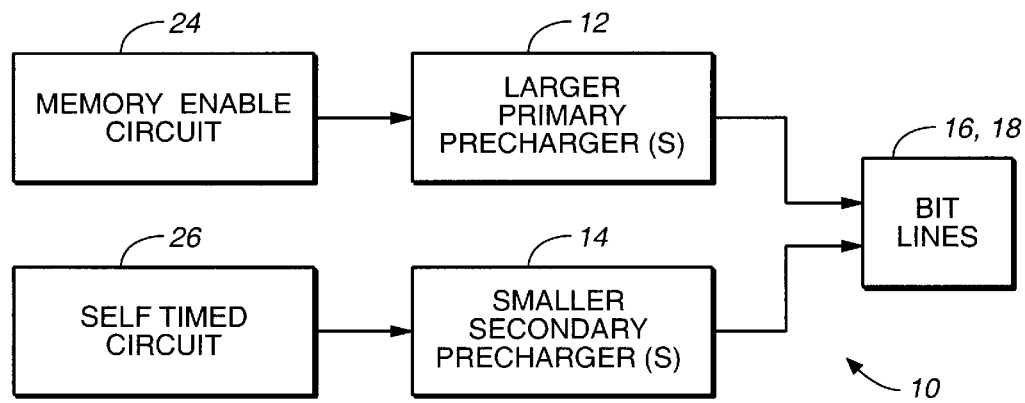
FIG._1
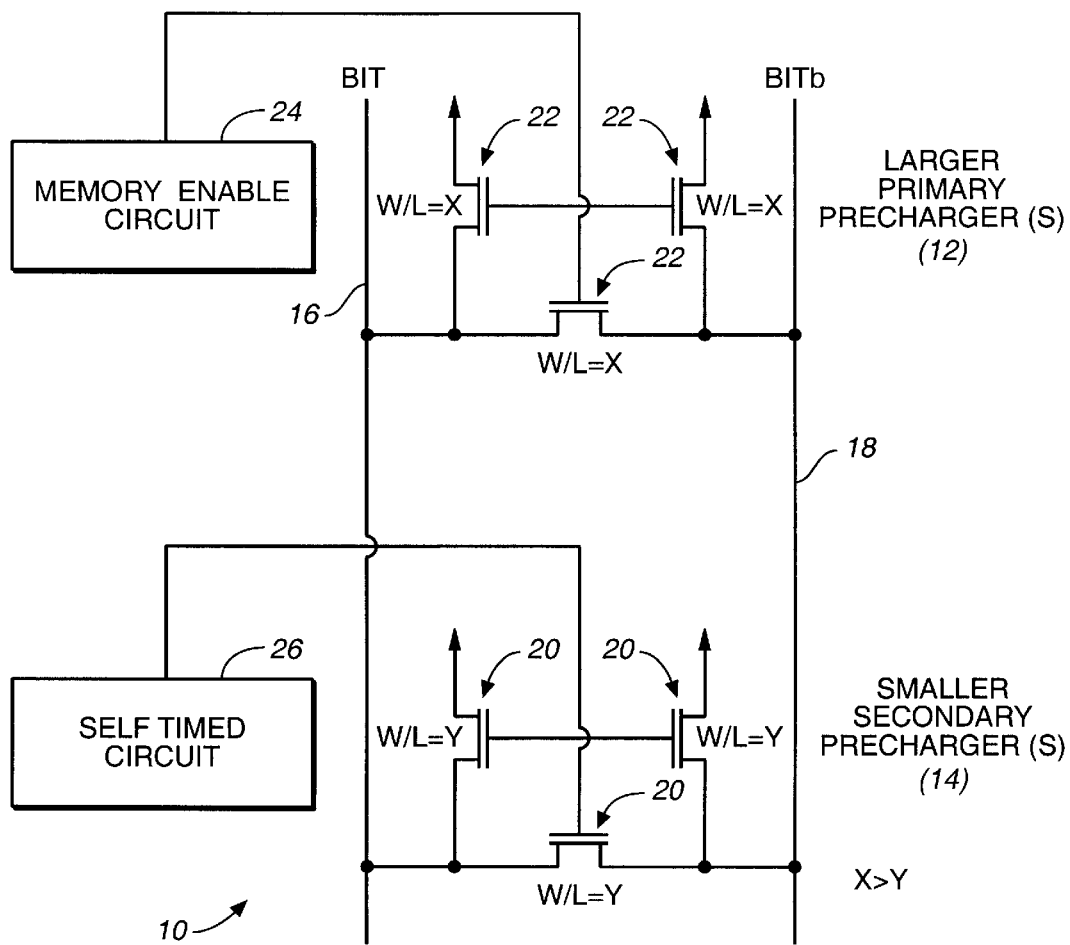
FIG._2

TECHNIQUE FOR REDUCING PEAK CURRENT IN MEMORY OPERATION

The present invention relates generally to circuits in memory devices for precharging bit lines, and more specifically relates to a circuit in a memory device and a method for precharging bit lines before a primary bit line precharge operation.

BACKGROUND OF THE INVENTION

A typical semiconductor memory device includes a plurality of memory cells or bitcells arranged in arrays, and a memory cell selector means for enabling the selection of a particular memory cell to facilitate the reading of data from, or the writing of data to, that particular memory cell.

For example, a high density dynamic random access memory (DRAM) includes a plurality of core cell blocks, and each core cell block contains several memory cells. The memory cells are metal-oxide semiconductor field-effect transistors (MOSFETs), and each MOSFET acts as a switch. To this end, each pair of MOSFETs is connected to a pair of bit lines (an input/output or I/O port), and the capacitance of each MOSFET can be charged by data. While one of the bit lines is the data itself, the other bit line is the complement data.

A bit line sense amplifier is provided in communication with a pair of bit lines corresponding to a set of memory cells. Each bit line sense amplifier amplifies the data which is read from the corresponding memory cell through the bit line pair or I/O port.

Before a typical read or write cycle, both bit lines of a memory cell are precharged. Then, during the data read or data write, the bit lines pass through a column decode (pass gates) and are routed to the bit line sense amplifier. When the inputs to the bit line sense amplifier trip, the data is known. After the inputs propagate through the bit line sense amplifier to the data output latch, the data read is complete, and the bit lines are again precharged to initiate the next data read or data write.

Due to the number of bit lines being precharged and their state before the precharge, the current peak when the precharge is initiated can be the peak current reached during the typical operation of the memory. As memory usage on a chip increases, it is desirable to minimize the peak current draw in order to minimize drooping in power supplies and prevent performance from suffering. For example, decreasing the peak current draw may alleviate constraints on power bus size and routing. Because the current peak when the precharge is initiated can be the peak current reached during typical operation and it is desirable to minimize peak current draw, it is desirable to minimize the current peak experienced while precharging the bit lines.

OBJECTS AND SUMMARY

It is an object of the present invention to reduce the current peak which is reached during the precharging of bit lines in a memory device.

It is a further object of the present invention to reduce the peak current reached during operation of a memory device.

It is a further object of the present invention to gradually precharge bit lines in a memory device before the initiation of a primary bit line precharge operation.

In accordance with these and other objects, the present invention provides a circuit in a memory device and a method for precharging at least one bit line in the memory device. The circuit includes a primary precharger and a secondary precharger in communication with the bit line. The secondary precharger gradually precharges the bit line before the primary precharger precharges the bit line between memory operations.

Preferably, the memory device is a dynamic random access memory device. Also, preferably the primary precharger includes pullup devices which are larger than pullup devices of the secondary precharger, and the primary precharger and secondary precharger are separate and independent from each other. A memory enable circuit is in communication with the primary precharger, and the primary precharger is configured to trigger off of an external enable signal which is received from the memory enable circuit. A self timed circuit is in communication with the secondary precharger, and the secondary precharger is configured to trigger off of an internal signal which is received from the self timed circuit. Preferably, the self timed circuit is a wordline which de-asserts prior to completion of a memory access, and the internal signal which triggers the secondary precharger is a self timed wordline signal. Preferably, the secondary precharger is configured to enable and gradually precharge the bit line once the wordline enable de-asserts, and the secondary precharger is enabled before the primary precharger is enabled.

As a result of precharging the bit line using a secondary precharger before using a primary precharger to precharge the bit line, preferably the current peak which is reached during the precharging of the bit line is reduced as well as the peak current reached during operation of the memory device.

BRIEF DESCRIPTION OF THE DRAWINGS

The present invention and the advantages thereof will become more apparent upon consideration of the following detailed description when taken in conjunction with the accompanying drawings of which:

FIG. 1 is a block diagram illustrating a precharge configuration which is in accordance with an embodiment of the present invention; and FIG. 2 is a more detailed block diagram of the precharge configuration which is illustrated in FIG. 1.

DETAILED DESCRIPTION OF AN EMBODIMENT OF THE INVENTION

Illustrated in FIGS. 1 and 2 is a precharge circuit configuration 10 which is in accordance with an embodiment of the present invention. Preferably, the circuit 10 is employed in a synchronous memory device such as in a dynamic random access memory (DRAM) device, and provides a primary precharger 12 as well as a secondary precharger 14 connected to, and in communication with, a pair of bit lines, 16 and 18, where one bit line 16 is data itself of a memory cell, and the other bit line 18 is the complement data.

Although not specifically shown, the bit lines 16, 18 are preferably connected to a bit line sense amplifier or some other type of sensor through a column decode block and are in communication with a memory cell or bitcell. During a data read, the memory cell drives the bit lines 16, 18, the column decode logic connects the bit lines 16, 18 to the bit line sense amplifier inputs, and the bit line sense amplifier compares the charge level of the bit lines 16, 18 and senses which bit line 16 or 18 has the higher charge. The primary precharger 12 and secondary precharger 14 precharge the bit lines 16, 18 to prepare the bit lines 16, 18 for a subsequent data read or data write operation.

The secondary precharger 14 is configured to gradually precharge the bit lines 16, 18 before the primary precharger 12 is enabled to complete the precharging of the bit lines 16, 18. By using the secondary precharger 14 to initiate a gradual precharge of the bit lines 16, 18 before enabling the primary precharger 12 to complete the precharge operation, the peak current seen when enabling the primary precharger 12 is reduced. Because the current peak when the precharge is initiated can be the peak current reached during typical operation, reducing the peak current seen during the precharging of the bit lines 16, 18 may, in effect, also be a reduction in the peak current which is reached during typical operation. As a result, drooping in power supplies and a compromise in performance may be prevented. For example, decreasing the peak current draw may alleviate constraints on power bus size and routing in some applications.

Preferably, the prechargers 12 and 14 are separate and independent from each other. As shown in FIG. 2, each precharger 12 and 14 may consist of a network of a plurality of pullup devices, such as transistors. Preferably, each pullup device 20 of the secondary precharger 14 is smaller than each pullup device 22 of the primary precharger 12. Specifically, preferably the width/length (W/L) ratio of each pullup device 20 of the secondary precharger 14 is smaller than the W/L ratio of each pullup device 22 of the primary precharger 12.

FIG. 2 illustrates the case where each precharger 12 and 14 consists of three transistors. Specifically, the primary precharger 12 consists of a network of three identical transistors each having a W/L ratio equal to x, and the secondary precharger 14 consists of a network of three identical transistors each having a WAL ratio equal to y, where x is greater than y. Because the transistors of the primary precharger 12 have larger W/L ratios than those of the secondary precharger 14, the transistors of the primary precharger 12 are stronger and can pass more current, and therefore use more power than do the transistors of the secondary precharger 14. In other words, the drive strength and saturation current of the secondary precharger 14 is lower than that of the primary precharger 12. Thus, when the secondary precharger 14 enables, it uses less power than does the primary precharger 12.

In communication with the primary precharger 12 is a memory enable circuit 24. The memory enable circuit 24 provides an external enable signal which triggers the primary precharger 12 to precharge the bit lines 16, 18. However, before the memory enable circuit 24 provides the external enable signal to the primary precharger 12, the secondary precharger 14 is enabled to gradually precharge the bit lines 16, 18 so that the primary precharger 12 need not do as much work later to get the bit lines 16, 18 in their precharged state.

In communication with the secondary precharger 14 is a self timed circuit 26 which provides an internal self timed signal to the secondary precharger 14 which triggers the secondary precharger 14 to gradually precharge the bit lines 16, 18 before the primary precharger 12 is enabled. The self timed signal relates to when the bit lines 16, 18 are no longer needed. Specifically, the self timed circuit 26 may comprise a wordline which de-asserts before completion of a memory access. As soon as the wordline enable de-asserts, this signal is used to drive the pullup devices 20 of the secondary precharger 14 to gradually precharge the bit lines 16, 18. At a later point in time, the memory enable circuit 24 provides the external enable signal which triggers the primary precharger 12 to finish the precharging of the bit lines 16, 18 to their precharged state. As a result of the gradual, generally weaker, precharging of the bit lines 16, 18 by the secondary precharger 14 before the primary precharger 12 is enabled, the peak current draw caused by the precharging of the bit lines 16, 18 by the primary precharger 12 is reduced. The longer the secondary precharger 14 is enabled before the primary precharger 12 is enabled, the smaller the peak current will be due to the enabling of the primary precharger 12. Due to the pullup devices 20 of the secondary precharger 14 being smaller than those of the primary precharger 12 as discussed hereinabove, their current draw will be less than that of the pullup devices 22 of the primary precharger 12. The size of the secondary precharger 14 can be specifically selected to minimize the peak current draw based upon how long the pullup devices 20 of the secondary precharger 14 will be on prior to enabling the pullup devices 22 of the primary precharger 12.

While a preferred embodiment of the present invention is shown and described, it is envisioned that those skilled in the art may devise various modifications of the present invention without departing from the spirit and scope of the appended claims.

What is claimed is:

1. A circuit in a memory device for precharging at least one bit line in the memory device, said circuit comprising:
   a primary precharger in communication with the bit line; and
   a secondary precharger in communication with the bit line, wherein said secondary precharger precharges the bit line before said primary precharger precharges the bit line between memory operations.

2. The circuit of claim 1, wherein said memory device comprises a dynamic random access memory.

3. The circuit of claim 1, wherein said secondary precharger includes at least one pullup device which is smaller than a pullup device of said primary precharger.

4. The circuit of claim 1, wherein said primary precharger and said secondary precharger are separate and independent from each other.

5. The circuit of claim 1, further comprising a memory enable circuit in communication with said primary precharger, wherein said primary precharger is configured to trigger off of an external enable signal which is received from said memory enable circuit.

6. The circuit of claim 1, further comprising a self timed circuit connected to said secondary precharger, wherein said secondary precharger is configured to trigger off of an internal signal which is received from said self timed circuit.

7. The circuit of claim 6, wherein said at least a portion of self timed circuit de-asserts prior to completion of a memory access, wherein said internal signal comprises a self timed wordline signal, and wherein said secondary precharger is configured to enable and gradually precharge the bit line once the wordline enable de-asserts.

8. The circuit of claim 1, further comprising a memory enable circuit connected to said primary precharger, wherein said primary precharger is configured to trigger off of an external enable signal which is received from said memory enable circuit, and further comprising a self timed circuit connected to said secondary precharger, wherein said secondary precharger is configured to trigger off of an internal signal which is received from said self timed circuit.

9. A circuit in a dynamic random access memory for precharging at least one bit line in the memory device, said circuit comprising:
   a primary precharger in communication with the bit line;
   a secondary precharger in communication with the bit line, wherein said secondary precharger gradually precharges the bit line before said primary precharger precharges the bit line between memory operations, wherein said secondary precharger includes at least one pullup device which is smaller than a pullup device of said primary precharger, and wherein said primary precharger and said secondary precharger are separate and independent from each other;

a memory enable circuit connected to said primary precharger, wherein said primary precharger is configured to trigger off of an external enable signal which is received from said memory enable circuit; and a wordline connected to said secondary precharger, wherein said wordline de-asserts prior to completion of a memory access, wherein said secondary precharger is configured to enable and gradually precharge the bit line once the wordline enable de-asserts.

10. A method of precharging at least one bit line in a memory device, said method comprising:

providing a primary precharger in communication with the bit line;

providing a secondary precharger in communication with the bit line; and using said secondary precharger to precharge the bit line before using said primary precharger to precharge the bit line between memory operations.

11. The method of claim 10, further comprising providing a dynamic random access memory.

12. The method of claim 10, further comprising providing at least one pullup device included in said secondary precharger, said pullup device being smaller than a pullup device of said primary precharger.

13. The method of claim 10, further comprising providing that said primary precharger and said secondary precharger are separate and independent from each other.

14. The method of claim 10, further comprising providing a memory enable circuit in communication with said primary precharger, and providing that said primary precharger is configured to trigger off of an external enable signal which is received from said memory enable circuit.

15. The method of claim 10, further comprising providing a self timed circuit connected to said secondary precharger, wherein said secondary precharger is configured to trigger off of an internal signal which is received from said self timed circuit.

16. The method of claim 15, further comprising providing that self timed circuit comprises a wordline which de-asserts prior to completion of a memory access, providing that said internal signal comprises a self timed wordline signal, and providing that said secondary precharger is configured to enable and gradually precharge the bit line once the wordline enable de-asserts.

17. The method of claim 10, further comprising providing a memory enable circuit connected to said primary precharger, wherein said primary precharger is configured to trigger off of an external enable signal which is received from said memory enable circuit, and further comprising providing a self timed circuit connected to said secondary precharger, wherein said secondary precharger is configured to trigger off of an internal signal which is received from said self timed circuit.

18. A method of precharging at least one bit line in a memory device, said method comprising:

providing a primary precharger in communication with the bit line;

providing a secondary precharger in communication with the bit line, wherein said secondary precharger is separate and independent from said primary precharger;

using said secondary precharger to gradually precharge the bit line before using said primary precharger to precharge the bit line between memory operations, wherein said secondary precharger includes at least one pullup device which is smaller than a pullup device of said primary precharger;

providing a memory enable circuit connected to said primary precharger, wherein said primary precharger is configured to trigger off of an external enable signal which is received from said memory enable circuit; and providing a wordline connected to said secondary precharger, wherein said wordline de-asserts prior to completion of a memory access, wherein said secondary precharger is configured to enable and gradually precharge the bit line once the wordline enable de-asserts.

* * * * *